United States Patent [19]
McKibben

[11] 3,758,865
[45] Sept. 11, 1973

[54] BIAS VOLTAGE GENERATOR FOR THE VOLTAGE-RESPONSIVE TUNING ELEMENTS IN AN ELECTRONICALLY TUNED RADIO RECEIVER

[75] Inventor: James L. McKibben, Kokomo, Ind.
[73] Assignee: General Motors Corporation, Detroit, Mich.

[22] Filed: Jan. 18, 1972
[21] Appl. No.: 218,788

[52] U.S. Cl. .................. 325/418, 325/453, 325/464, 331/1 R
[51] Int. Cl. .............................................. H04b 1/16
[58] Field of Search..................... 325/416, 417, 418, 325/465, 464, 419, 420, 421, 422, 423, 453; 334/14; 331/1 A, 1 R, 17, 30, 36, 40, 41, 34, 177 R

[56] References Cited

UNITED STATES PATENTS

| | | | |
|---|---|---|---|
| 2,922,118 | 1/1960 | Albright | 331/1 R |
| 3,573,650 | 4/1971 | Maltese | 331/1 R |
| 3,569,838 | 3/1971 | Blair | 325/184 |
| 3,440,544 | 4/1969 | Pampel | 325/453 |
| 3,354,397 | 11/1967 | Wittig | 325/453 |

*Primary Examiner*—Robert L. Griffin
*Assistant Examiner*—William T. Ellis
*Attorney*—C. R. Meland et al.

[57] ABSTRACT

A circuit for tuning an electronically tuned radio receiver in which the tuning voltage for tuning the radio receiver is supplied to the positive input of a first differential amplifier having a high gain whose output is connected across a voltage responsive capacitive element for controlling the frequency of oscillation of a voltage controlled local oscillator. The output of this voltage controlled local oscillator is supplied to a linear frequency-to-voltage converter whose output is supplied to the negative input of the first differential amplifier to maintain the output of the local oscillator a linear function of the tuning voltage. The tuning voltage is also supplied to the positive input of a second differential amplifier whose output is supplied to the positive input of a third differential amplifier having a high gain. The output of this amplifier is connected across a voltage responsive capacitive element in a reference voltage controlled oscillator to control the frequency of oscillation thereof and across respective voltage responsive capacitive elements in the antenna and RF tuned circuits to control the tuned frequency thereof. The output of the reference voltage controlled oscillator is supplied to a linear frequency-to-voltage converter whose output is connected to the negative input of the third differential amplifier to maintain the frequency at which the reference voltage controlled oscillator, antenna and RF tuned circuits are tuned a linear function of the input voltage to the positive input of the third differential amplifier. A constant DC voltage is supplied to the negative input of the second differential amplifier to effect the tracking of the antenna and RF tuned circuits to the output of the voltage controlled local oscillator at a constant difference frequency equal to the IF frequency.

2 Claims, 3 Drawing Figures

BIAS VOLTAGE GENERATOR FOR THE VOLTAGE-RESPONSIVE TUNING ELEMENTS IN AN ELECTRONICALLY TUNED RADIO RECEIVER

This invention relates to an electronically tuned radio receiver and more specifically, this invention relates to a circuit for generating the bias voltages for the voltage responsive reactive elements in the local oscillator, antenna and RF tuned circuits of an electronically tuned radio receiver whereby the tuned frequency of the radio receiver vs. tuning voltage characteristic is linear and in which the tuned circuits are in track throughout the frequency band of the radio receiver.

Voltage responsive reactive elements for use in tuning radio receivers are difficult to manufacture having predetermined and repeatable capacitance vs. bias voltage characteristics. Consequently, they do not lend themselves to linearized dial calibration. Also, when a set of three voltage responsive reactive elements are used in the antenna, RF and local oscillator tuned circuits in a superheterodyne receiver, tracking of the antenna and RF tuned circuits with the local oscillator throughout the frequency band cannot be achieved through conventional tracking techniques. An example of one of these techniques (the technique most often used) is the three point tracking technique where the total oscillator tank capacitance is modified by adding series and parallel capacitors to cause the local oscillator to be in track with the remaining two tuned circuits at three points in the frequency band. At every other point, the tuned circuits are not in track causing a resultant decrease in sensitivity.

It is one object of this invention to provide an electronically tuned radio receiver having a linear frequency vs. tuning voltage characteristic.

It is another object of this invention to provide a circuit for biasing voltage responsive reactive tuning elements in the antenna, RF and local oscillator tuned circuits to cause the frequency of the radio receiver to vary linearly in response to a tuning voltage.

It is another object of this invention to provide an electronically tuned radio receiver in which the antenna, RF and local oscillator tuned circuits track throughout the frequency band of the radio receiver.

It is another object of this invention to provide a circuit for biasing the voltage responsive reactive elements in the antenna, RF and local oscillator tuned circuits in a superheterodyne receiver for causing the antenna, mixer and local oscillator to track throughout the frequency band of the radio receiver linearly as a function of a tuning voltage.

These and other objects of this invention are accomplished by linearizing the outputs of two voltage controlled oscillators having nonlinear characteristics in response to a tuning voltage input, the first oscillator of which is used as the local oscillator of the radio receiver. The outputs of the voltage controlled oscillators are linearized with respect to a tuning voltage input by supplying the outputs thereof to respective linear frequency-to-voltage converters whose outputs are then subtracted from the tuning voltage. This difference is amplified by a high gain amplifier whose output is utilized to bias voltage responsive reactive elements in the voltage controlled oscillators to control the frequencies thereof. As will hereinafter be described, the frequencies of the respective voltage controlled oscillators are primarily a function of the magnitude of the input tuning voltage and the characteristics of the linear frequency-to-voltage converters. As the frequency-to-voltage converters can be designed to provide a linear output as a function of the input frequency over the frequency band of the radio receiver, the output frequency of the voltage controlled oscillators are linear as a function of the input tuning voltage.

The bias voltage supplied to the voltage responsive reactive element in the second voltage controlled oscillator is also supplied to respective voltage responsive reactive elements in the antenna and RF tuned circuits to provide tuning thereof in the same linear fashion as the outputs of the voltage controlled oscillators. To provide for the IF offset, a constant DC voltage is subtracted from the tuning voltage input with the net voltage being supplied for tuning the second voltage controlled oscillator and the antenna and RF tuned circuits. As will be shown in the following description of the preferred embodiment, the local oscillator, antenna and RF tuned circuits will track throughout the frequency band of the radio receiver.

The output of the local oscillator (the first voltage controlled oscillator) and the RF tuned circuit are supplied to a mixer stage which in turn supplies the IF signal to the remaining stages of the radio receiver.

The invention may be best understood by reference to the following description of a preferred embodiment and the figures in which.

Figure 1:
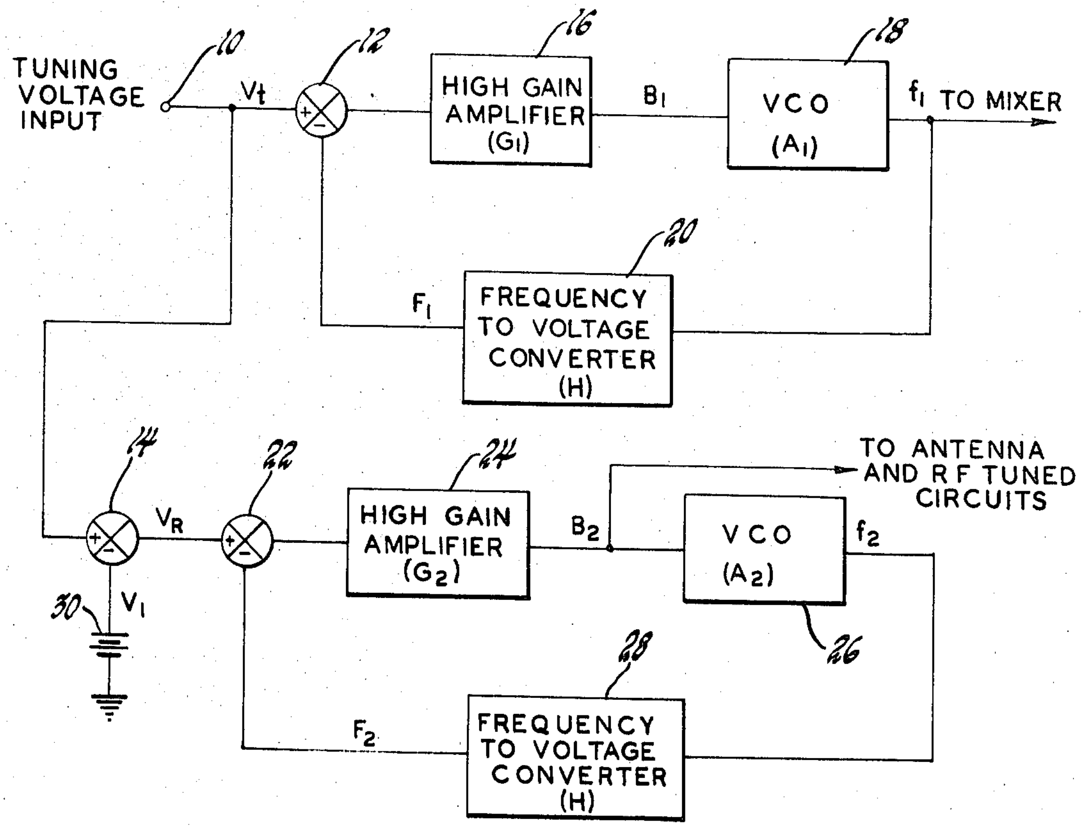
FIG. 1 is a block diagram of the preferred embodiment of the invention.

Referring to FIG. 1, a tuning voltage $V_t$ for tuning an electronically tunable radio receiver is applied at a tuning voltage input terminal 10 which is connected to the positive inputs of a difference detector 12 and a difference detector 14. The output of the difference detector 12 is supplied to a high gain amplifier 16 whose output is supplied to a voltage controlled oscillator 18. The voltage controlled oscillator 18 functions as the local oscillator of the radio receiver whose output is supplied to the mixer stage (not shown). This output is also supplied to the input of a linear frequency-to-voltage converter 20. The output of the voltage controlled oscillator 18 is a nonlinear function of the magnitude of the input voltage thereto from the high gain amplifier 16 primarily as a result of the nonlinear characteristics of the voltage responsive reactive element contained therein for tuning purposes. The frequency-to-voltage converter 20 is responsive to the frequency of oscillation $f_1$ of the voltage controlled oscillator 18 to supply to the negative input of the difference detector 12 a signal which is linearly proportional to said frequency. The difference detector 12, the high gain amplifier 16, the voltage controlled oscillator 18 and the frequency-to-voltage converter 20 form a closed-loop system having negative feedback to a high gain forward branch for providing a linear output frequency $f_1$ vs. tuning voltage $V_t$ input characteristic irrespective of the nonlinear characteristic of the voltage controlled oscillator 18. This can be illustrated as follows:

If the voltage-to-voltage transfer function of the high gain amplifier 16 is $G_1$, the nonlinear transfer function of the voltage controlled oscillator 18 is $A_1$ and the linear transfer function of the frequency-to-voltage converter 20 is H, the expressions for the output $B_1$ of the high gain amplifier 16, the output frequency $f_1$ of the voltage controlled oscillator 18 and the output $F_1$ of the frequency-to-voltage converter 20 are respectively as follows:

1. $B_1 = (V_t - F_1)\ G_1$
2. $f_1 = A_1 B_1$
3. $F_1 = H f_1$ .

From equations 1, 2 and 3, the following expression for $f_1$ is developed:

4. $f_1 = (A_1 G_1 V_t / 1 + A_1 G_1 H)$ .

If $A_1 G_1 H$ is made much greater than 1, equation 4 can be rewritten as follows:

5. $f_1 = V_t / H$ .

Assuming that the frequency-to-voltage converter 20 is linear over the frequency band of the radio receiver, $H$ is a constant. Consequently, the output frequency $f_1$ of the voltage controlled oscillator 18 is a linear function of the magnitude $V_t$ of the tuning voltage input irrespective of the nonlinear characteristics of the transfer function $A_1$ of the voltage controlled oscillator 18.

The output $V_R$ of the difference detector 14 is supplied to the positive input of a difference detector 22 whose output is supplied to a high gain amplifier 24. The output of the high gain amplifier 24 is supplied to a voltage controlled reference oscillator 26 whose output frequency $f_2$ is a function of the magnitude of the output of the high gain amplifier 24. The voltage controlled reference oscillator 26 is nonlinear for the same reasons the voltage controlled oscillator 18 is nonlinear. The output of the voltage controlled reference oscillator 26 is supplied to the input of a linear frequency-to-voltage converter 28 having the same characteristics as the frequency-to-voltage converter 20. The output of the frequency-to-voltage converter 28 is supplied to the negative input of the difference detector 22.

The output frequency $f_2$ of the voltage controlled reference oscillator 26 is a linear function of the magnitude of the voltage $V_R$ at the positive input of the difference detector 22. This can be illustrated as follows:

If the voltage-to-voltage transfer function of the high gain amplifier 24 is $G_2$, the nonlinear transfer function of the voltage controlled reference oscillator 26 is $A_2$ and the linear transfer function of the frequency-to-voltage converter 28 is $H$ (being identical to the frequency-to-voltage converter 20), the expressions for the output $B_2$ of the high gain amplifier 24, the output frequency $f_2$ of the voltage controlled reference oscillator 26 and the output $F_2$ of the frequency-to-voltage converter 28 are respectively as follows:

6. $B_2 = (V_R - F_2)\ G_2$
7. $f_2 = A_2 B_2$
8. $F_2 = H f_2$ .

From equations 6, 7 and 8, the following expression for $f_2$ is developed:

9. $f_2 = A_2 G_2 V_R / 1 + A_2 G_2 H$ .

If $A_2 G_2 H$ is made much greater than 1, equation 9 can be rewritten as follows:

10. $f_2 = V_R / H$ .

Consequently, the output frequency $f_2$ of the voltage controlled reference oscillator 26 is a linear function of the magnitude of $V_R$ irrespective of the nonlinear characteristics of the transfer function $A_2$ of the voltage controlled reference oscillator 26.

The output of the high gain amplifier 24 is also supplied to the antenna and RF tuned circuits having the same voltage responsive characteristics as the voltage controlled reference oscillator 26. Consequently, the antenna and RF tuned circuits are tuned to a frequency which is a linear relationship to the magnitude of the input voltage $V_R$ to the difference detector 22.

A constant DC voltage $V_I$ represented by a battery 30 is supplied to the negative input of the difference detector 14 so as to offset the input of the difference detector 22 a constant amount $V_I$ with respect to the tuning voltage $V_t$ input to the difference detector 14. $V_I$ is determined by the desired IF frequency of the radio receiver and is sufficient so as to tune the antenna and RF tuned circuits to a frequency different from the output frequency of the voltage controlled oscillator 18 equal to the desired IF frequency of the radio receiver. Thereafter, as the magnitude of the tuning voltage $V_t$ supplied to the tuning voltage input terminal 10 is varied to tune the radio receiver over its frequency band, the antenna and RF tuned circuits track the output of the voltage controlled oscillator 18 at the constant difference frequency. This can be illustrated as follows:

By combining the equations 5 and 10, the following equation is developed:

11. $f_1 - f_2 = V_t - V_R / H$ , where:

12. $V_R = V_t - V_I$ .

Substituting the expression for $V_R$ in equation 12 into equation 11

13. $f_1 - f_2 = V_I / H = f_I$ .

where the magnitude of $f_I$ is the IF frequency. For a given desired IF frequency $f_I$, the required magnitude of $V_I$ is determined by rearranging equation 13 to develop the following equation:

14. $V_I = H f_I$ .

Since $V_I$ and $H$ are both constants, $f_I$ is a constant as $V_t$ is varied to tune the radio receiver throughout its frequency band.

Figure 2:
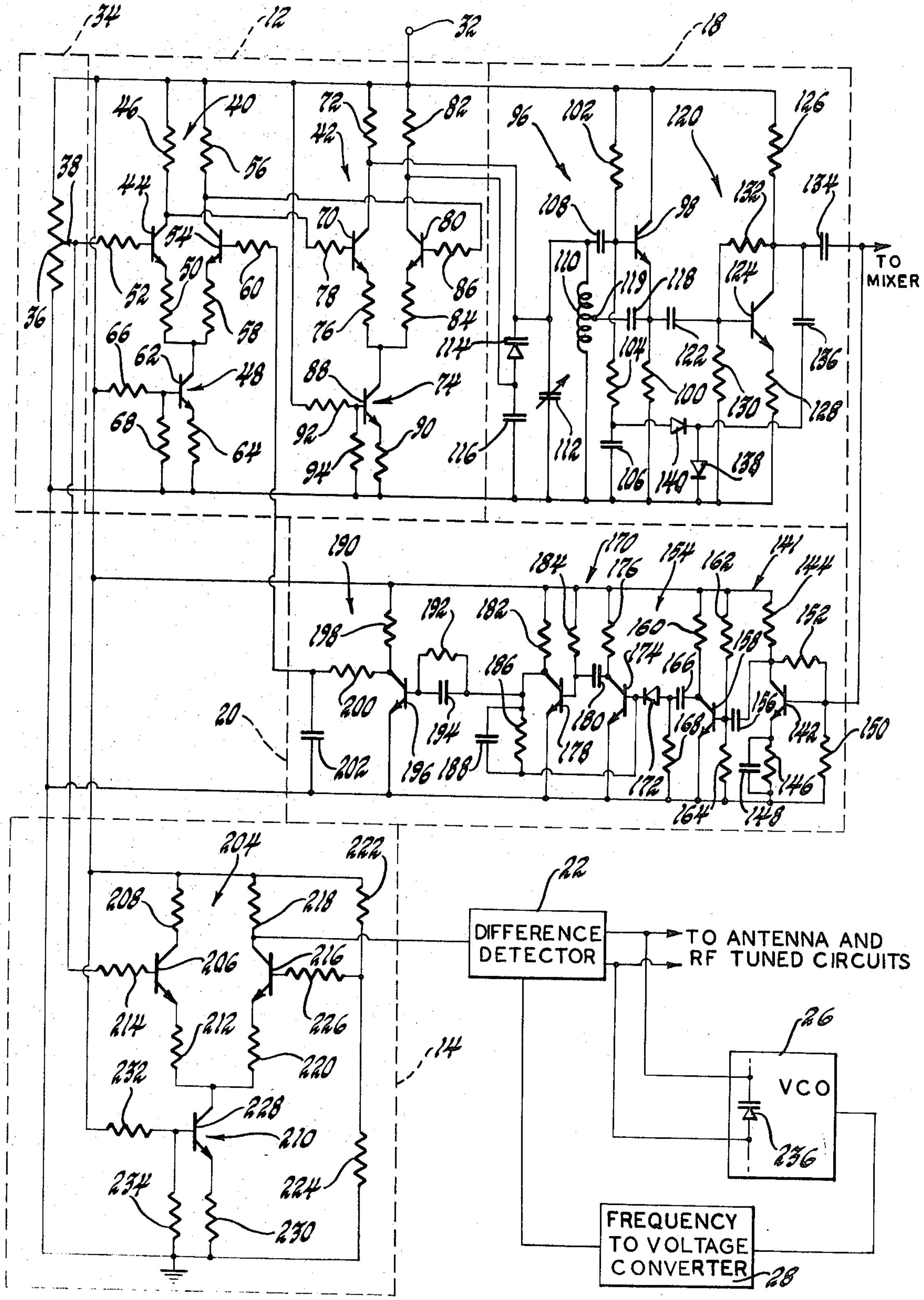
FIG. 2 is an electrical schematic of one means for mechanizing the functions illustrated in FIG. 1.

Referring to FIG. 2, there is shown an example of a circuit for mechanizing the block diagram of FIG. 1. A regulated voltage from a supply (not shown) is connected across ground and a terminal 32, the terminal 32 being positive with respect to ground. A tuning voltage generator 34 for tuning the radio receiver is comprised of a potentiometer 36 having a wiper arm 38 which supplies a tuning voltage $V_t$ to the difference detector 12 and the difference detector 14.

The difference detector 12 is comprised of a differential amplifier 40 and a differential amplifier 42. The differential amplifier 40 is comprised of an NPN transistor 44 having its collector connected to the terminal 32 through a resistor 46, its emitter connected to a constant current sink 48 through a resistor 50 and its base connected to the wiper arm 38 of the tuning voltage generator 34 through a resistor 52. The differential amplifier 40 also includes an NPN transistor 54 having its collector connected to the terminal 32 through a resistor 56, its emitter connected to the constant current sink 48 through a resistor 58 and its base connected to the output of the linear frequency-to-voltage converter 20 through a resistor 60. The constant current sink 48 is comprised of an NPN transistor 62 having its collector connected to the resistors 50 and 58, its emitter connected to ground through a resistor 64 and its base connected between resistors 66 and 68 which in turn are connected in series between ground and the terminal 32.

The output of the differential amplifier 40 is the potential across the collectors of the transistors 44 and 54, which output is supplied to the differential amplifier 42. The differential amplifier 42 is comprised of an NPN transistor 70 having its collector connected to the terminal 32 through a resistor 72, its emitter connected to a constant current sink 74 through a resistor 76 and its base connected to the collector of the transistor 44 through a resistor 78. The differential amplifier 42 also includes a transistor 80 having its collector connected to the terminal 32 through a resistor 82, its emitter connected to the constant current sink 74 through a resistor 84 and its base connected to the collector of the transistor 54 through a resistor 86. The constant current sink 74 is comprised of an NPN transistor 88 having its collector connected to the resistors 76 and 84, its emitter connected to ground through a resistor 90 and its base connected between resistors 92 and 94 which in turn are connected in series between ground and the terminal 32. The output of the difference detector 12 is the potential from the collector of the transistor 70 to the collector of the transistor 80. As the input to the difference detector 12 from the tuning voltage generator 34 increases, the output thereof increases and when the input to the difference detector 12 from the linear frequency-to-voltage converter 20 increases, the output thereof decreases. As can be seen, the output of the difference detector 12 is equal to the magnitude of the tuning voltage output of the tuning voltage generator 34 minus the magnitude of the output of the frequency-to-voltage converter 20 times the gain of the differential amplifiers 40 and 42. Due to the high gain of the differential amplifiers 40 and 42, the function of the high gain amplifier 16 in FIG. 1 is incorporated therein and further amplification is unnecessary.

The voltage controlled oscillator 18 includes a tuned circuit 96 which is comprised of an NPN transistor 98 having its collector connected to the terminal 32, its emitter connected to ground through a resistor 100 and its base connected to the terminal 32 through a resistor 102 and to ground through a resistor 104 and a capacitor 106. The base of the transistor 98 is also connected to ground through a capacitor 108 and a coil 110. A trimmer capacitor 112 is connected in parallel with the coil 110 as is the series combination of a voltage responsive reactive element 114 and a capacitor 116.

The voltage responsive reactive element 114 and those hereinafter referred to are shown as varactor diodes. A varactor diode is a diode that acts like a capacitor when its PN junction is back-biased, the magnitude of capacitance being inversely related to the magnitude of the back-bias. This device as well as other voltage responsive capacitive and inductive elements are well known and will not be described in greater detail except to point out that such devices are difficult to manufacture having a predetermined and repeatable change in reactance vs. change in bias voltage over the desired range. Consequently, tuned circuits using these devices respond nonlinearly as a function of the tuning voltage input.

A feedback capacitor 118 is connected between the emitter of the transistor 98 and a tap 119 of the coil 110 for maintaining the oscillations of the oscillator.

The output of the tuned circuit 96 at the emitter of the transistor 98 is supplied to an amplifier 120 through a capacitor 122. The amplifier 120 is comprised of an NPN transistor 124 having its collector connected to the terminal 32 through a resistor 126, its emitter connected to ground through a resistor 128 and its base connected to ground through a resistor 130. A feedback resistor 132 is connected between the collector and base electrodes of the transistor 124. The amplifier 120 amplifies the output signal from the tuned circuit 96 and supplies the amplified signal to the mixer stage (not shown) and to the frequency-to-voltage converter 20 through a capacitor 134.

An automatic gain control circuit for the voltage controlled oscillator 18 is comprised of a feedback circuit including a capacitor 136 connected to the collector of the transistor 124 and to the anode of a diode 138. The cathode of the diode 138 is connected to ground. The automatic gain control circuit also includes a diode 140 having its anode connected between the resistor 104 and the capacitor 106 and its cathode connected to the anode of the diode 138. The function of the automatic gain control circuit is to limit the AC signal on the voltage responsive reactive element 114.

The frequency-to-voltage converter 20 is comprised of an input amplifier 141 including an NPN transistor 142 having its collector connected to the terminal 32 through a resistor 144, its emitter connected to ground through the parallel combination of a resistor 146 and a capacitor 148 and its base connected to ground through a resistor 150. A feedback resistor 152 is connected between the collector and base of the transistor 142. The amplifier 141 receives an input on the base of the transistor 142 from the output of the voltage controlled oscillator 18. The amplified signal is supplied to a switch 154 through a coupling capacitor 156.

The switch 154 includes an NPN transistor 158 having its collector connected to the terminal 32 through a resistor 160, its emitter connected to ground and its base connected between a resistor 162 and 164 which in turn are connected in series between ground and the terminal 32 and to the coupling capacitor 156. The collector of the transistor 158 is also connected to ground through a differentiating capacitor 166 and a resistor 168. Upon each oscillation of the output of the voltage controlled oscillator 18, the switch 154 supplies a positive pulse to a single shot multivibrator 170 through a diode 172.

The single shot multivibrator 170 is comprised of an NPN transistor 174 having its collector connected to the terminal 32 through a resistor 176, its emitter connected to ground and its base connected to the cathode of the diode 172. The collector of the transistor 174 is also connected to the base of an NPN transistor 178 through a capacitor 180. The transistor 178 has its collector connected to the terminal 32 through a resistor 182, its emitter connected to ground and its base connected to the terminal 32 through a resistor 184. The collector of the transistor 178 is also connected to the base of the transistor 174 through the parallel combination of a feedback resistor 186 and feedback capacitor 188. With each positive pulse supplied to the base of the transistor 174 from the switch 154, the single shot multivibrator 170 supplies at the collector of the transistor 178, a pulse having constant amplitude and constant width. This pulse is applied to a buffer amplifier and integrator 190 through the parallel combination of a coupling resistor 192 and a coupling capacitor 194.

The buffer amplifier and integrator 190 is comprised of an NPN transistor 196 having its collector connected to the terminal 32 through a resistor 198, its emitter connected to ground, and its base connected to the resistor 192 and the capacitor 194. The collector electrode of the transistor 196 is also connected to ground through a resistor 200 and a capacitor 202. The output of the frequency voltage converter 20 is supplied from between the resistor 200 and the capacitor 202 which output is comprised of a DC voltage having a magnitude directly proportional to the frequency at the input thereof from the output of the voltage controlled oscillator 18. This output voltage is supplied to the base of the transistor 54 in the difference detector 12 through the resistor 60. The specific design of the frequency-to-voltage converter 20 is not limited to the circuit shown, the only requirement being that the output is a linear function of the input over the frequency band of the radio receiver.

As previously described with reference to FIG. 1, the output of the voltage controlled oscillator 18, which oscillator is used as the local oscillator of the radio receiver, is a signal having a frequency which is linearly proportional to the magnitude of the tuning voltage signal at the output of the tuning voltage generator 34, irrespective of its nonlinear characteristics resulting from the voltage responsive reactive element 114.

The difference detector 14 is comprised of a differential amplifier 204 which is comprised of an NPN transistor 206 having its collector connected to the terminal 32 through a resistor 208, its emitter connected to a constant current sink 210 through a resistor 212 and its base connected to the wiper arm 38 of the tuning voltage generator 34 through a resistor 214. The differential amplifier 204 is also comprised of an NPN transistor 216 having its collector connected to the terminal 32 through a resistor 218, its emitter connected to the constant current sink 210 through a resistor 220 and its base connected between the junction of a resistor 222 and a resistor 224 through a resistor 226. The resistors 222 and 224 are connected in series between ground and the terminal 32 and comprise a voltage divider for supplying to the base of the transistor 216 the constant voltage $V_1$ which was represented by the battery 30 of FIG. 1. The constant current sink 210 is comprised of a transistor 228 having its collector connected to the resistors 212 and 220, its emitter connected to ground through a resistor 230, and its base connected at the junction of the resistor 232 and a resistor 234 which are connected in series between ground and the terminal 32. The output of the difference detector 14 is taken at the collector of the transistor 216 which output represents the difference between the magnitude of the tuning voltage supplied by the tuning voltage generator 34 and the potential developed at the junction of the voltage divider comprised of the resistors 222 and 224. The output of the difference detector 14 is supplied to the positive input of the difference detector 22 which receives a negative input from the frequency-to-voltage converter 28. The difference detector 22 is identical in structure and operation to the difference detector 12 previously described and consequently is not shown or described in detail. The output of the difference detector 22 is a voltage which is applied across a voltage responsive reactive element 236 in the voltage controlled reference oscillator 26 which is identical in construction and operation to the voltage controlled oscillator 18 previously described. The output of the voltage controlled reference oscillator 26 is supplied to the linear frequency-to-voltage converter 28 whose output is supplied to the difference detector 22. The construction and operation of the frequency-to-voltage converter 28 is identical to the frequency-to-voltage converter 28 previously described. The output of the difference detector 22 is also supplied to the antenna and RF tuned circuits for the tuning thereof to a frequency which is a linear function of the tuning voltage and which is different from the output of the voltage controlled oscillator 18 by an amount equal to the IF which is determined by the output of the difference detector 14 as described with reference to FIG. 1.

Figure 3:
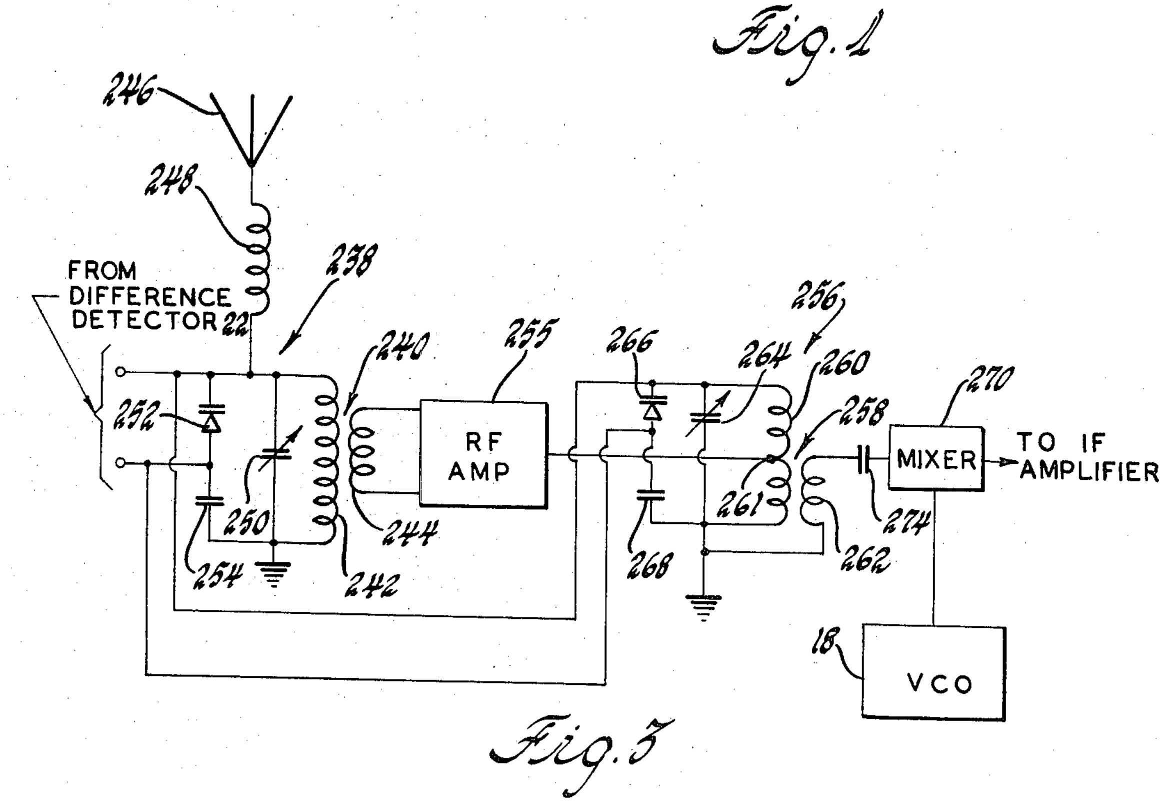
FIG. 3 is a partial schematic of a radio receiver used in conjunction with the electrical schematic illustrated in FIG. 2.

Referring to FIG. 3, an antenna tuned circuit 238 includes an antenna coil 240 having a primary winding 242 and a secondary winding 244. The primary winding 242 is connected to ground and to an antenna 246 through a noise choke 248. A trimming capacitor 250 is connected in parallel with the primary winding 242. The series combination of a voltage responsive reactive element 252 and a capacitor 254 is also connected in parallel with the primary winding 242. The tuned circuit 238 is tuned to the desired frequency by the potential across the voltage responsive reactive element 252 from the output of the difference detector 22 in FIG. 2. The received signal at the tuned frequency is supplied to the RF amplifier 255 by the secondary winding 244 of the antenna coil 240. This signal is amplified and supplied to the RF tuned circuit 256 which is comprised of an RF coil 258 having a primary winding 260 and a secondary winding 262. A trimmer capacitor 264 is connected in parallel with the primary winding 260. The series combination of a voltage responsive reactive element 266 and a capacitor 268 are also connected parallel with the primary winding 260. The output of the RF amplifier is supplied to a tap 261 on the primary winding 260. The RF tuned circuit 256 is tuned by the bias supplied across the voltage responsive reactive element 266 from the output of the difference detector 22 in FIG. 2. The output of the RF tuned circuit 256 is supplied to a mixer stage 270 through a coupling capacitor 274. The mixer stage also receives the output of the voltage controlled oscillator 18 and supplies an output to an IF amplifier (not shown). The RF amplifier 255 and the mixer in addition to the remaining stages of the radio receiver are of conventional design and consequently, are not shown in detail.

The detailed description of a preferred embodiment of the invention for the purpose of explaining the principles thereof is not to be considered as limiting or restricting the invention, since many modifications may be made and different circuits may be used to accomplish the same functions by the exercise of skill in the art without departing from the scope of the invention.

I claim:

1. A superheterodyne radio receiver having an intermediate frequency $f_1$, comprising, means for generating a tuning voltage having a magnitude $V_t$; first differential amplifier means having a voltage-to-voltage gain $G_1$ for subtracting the magnitude of a signal supplied to a first terminal thereof from the magnitude of a signal supplied to a second terminal thereof and generating a first bias voltage having a magnitude $B_1$ equal to the difference times $G_1$; means for coupling the tuning voltage having the magnitude $V_t$ to the second terminal of the first differential amplifier means; a voltage tuned local oscillator coupled to the output of the first differential amplifier means and having a nonlinear transfer function $A_1$ for developing a local signal having a frequency $f_1$ equal to $A_1B_1$; a first frequency-to-voltage converter coupled to the output of the voltage tuned local oscillator and having a linear transfer function H for developing a first feedback signal having a magnitude $F_1$ equal to $Hf_1$; means for coupling the first feedback signal to the first terminal of the first differential amplifier means, said functions $A_1$, $G_1$ and H having a product much greater than unity whereby $f_1$ substantially equals $V_t/H$ ; second differential amplifier means having a voltage-to-voltage gain $G_2$ for subtracting the magnitude of a signal supplied to a first terminal thereof from the magnitude of a signal supplied to a second terminal thereof and generating a second bias voltage having a magnitude $B_2$ equal to the difference times $G_2$; a voltage tuned reference oscillator coupled to the second differential amplifier means and having a nonlinear transfer function $A_2$ for developing a reference signal having a frequency $f_2$ equal to $A_2B_2$; a second frequency-to-voltage converter coupled to the output of the voltage tuned reference oscillator and having the linear transfer function H for developing a second feedback signal having a magnitude $F_2$ equal to $Hf_2$; means for coupling the second feedback signal to the first terminal of the second differential amplifier means; means coupled to the means for generating a tuning voltage for generating a reference tuning voltage having a magnitude $V_R$ spaced from the tuning voltage having the magnitude $V_t$ by a constant having a magnitude $V_I$ equal to $Hf_I$; means for coupling the reference tuning voltage having the magnitude $V_R$ to the second terminal of the second differential amplifier means; said functions $A_2$, $G_2$ and $H$ having a product much greater than unity whereby $f_2$ substantially equals $V_R$/H ; and a voltage responsive tuned circuit coupled to the output of the second differential amplifier means and having the nonlinear transfer function $A_2$ for tuning the radio receiver to the frequency $f_2$; whereby the radio receiver is tuned to a frequency $f_2$ which is spaced from the frequency $f_1$ of the output signal of the voltage tuned local oscillator by the frequency $f_I$ and the tuned frequency $f_2$ is linearly related to the magnitude $V_t$ of the tuning voltage.

2. In an electronically tunable radio receiver having antenna, RF and local oscillator circuits, each circuit including a tuned circuit having a voltage responsive reactive element responsive to a bias voltage applied thereacross for tuning the radio receiver over its frequency band, the local oscillator having a nonlinear voltage-to-frequency transfer function $A_1$ and the antenna and RF circuits each having a nonlinear voltage-to-frequency transfer function $A_2$, a circuit for biasing each of the voltage responsive reactive elements comprising, in combination, a tuning voltage generator for generating a tuning voltage at an output thereof to effect tuning of the radio receiver; a first differential amplifier having first and second inputs and a gain $G_1$ for subtracting a voltage at its second input from a voltage at its first input and generating an output voltage signal equal to the difference times the gain $G_1$; means for applying the output voltage signal of the first differential amplifier across the voltage responsive reactive element in the tuned circuit of the local oscillator, the local oscillator having a frequency of oscillation determined by the amplitude of said signal; a first frequency-to-voltage converter having a linear transfer function H connected to the output of the local oscillator and the second input of the first differential amplifier for supplying to the second terminal of the first differential amplifier a voltage having a magnitude linearly related to the frequency of oscillation of the local oscillator, the product of the functions $A_1$, $G_1$ and $H$ being much greater than unity; means connecting the output of the tuning voltage generator to the first input of the first differential amplifier; a second differential amplifier having first and second inputs, said amplifier being effective to subtract a voltage at its second input from a voltage at its first input and generating an output voltage signal equal to the difference; means connecting the output of the tuning voltage generator to the first input of the second differential amplifier; a reference oscillator having the nonlinear voltage-to-frequency transfer function $A_2$ and having a tuned circuit including a voltage responsive reactive element responsive to a bias voltage applied thereacross for tuning the reference oscillator; a third differential amplifier having a gain $G_2$ and having a first input connected to the output of the second differential amplifier and a second input for subtracting a voltage at its second input from a voltage at its first input and generating an output signal equal to the difference times the gain $G_2$; means for applying the output voltage signal of the third differential amplifier across the voltage responsive reactive element in the tuned circuit of the reference oscillator, the reference oscillator having a frequency of oscillation determined by the amplitude of said signal; a second frequency-to-voltage converter having the linear transfer function H connected to the output of the reference oscillator and to the second input of the third differential amplifier for supplying to the second terminal of the third differential amplifier a voltage having a magnitude linearly related to the frequency of oscillation of the reference oscillator, the product of $A_2$, $G_2$ and $H$ being much greater than unity; means applying the output voltage of the third differential amplifier across the voltage responsive reactive elements in the antenna and RF tuned circuits, the antenna and RF tuned circuits being tuned to a frequency determined by the amplitude of said signal; means for supplying a bias signal to the second input of the second differential amplifier to cause the antenna and RF tuned circuits to be tuned to a frequency different from the frequency of the output signal of the local oscillator by an amount equal to a desired IF frequency, the magnitude of the bias signal being equal to $H$ times the IF frequency, whereby the antenna, RF and local oscillator tuned circuits are in track throughout the frequency band of the radio receiver and the tuned frequency of the radio receiver is a linear function of the tuning voltage at the output of the tuning voltage generator.

* * * * *